United States Patent
Altini et al.

(10) Patent No.: US 11,360,395 B2
(45) Date of Patent: Jun. 14, 2022

(54) CONTROL METHOD FOR A SCANNING EXPOSURE APPARATUS

(71) Applicant: ASML NETHERLANDS B.V., Veldhoven (NL)

(72) Inventors: Valerio Altini, Eindhoven (NL); Frank Staals, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 16/978,445

(22) PCT Filed: Feb. 12, 2019

(86) PCT No.: PCT/EP2019/053376
§ 371 (c)(1),
(2) Date: Sep. 4, 2020

(87) PCT Pub. No.: WO2019/185230
PCT Pub. Date: Oct. 3, 2019

(65) Prior Publication Data
US 2021/0096472 A1 Apr. 1, 2021

(30) Foreign Application Priority Data

Mar. 29, 2018 (EP) .................................. 18164962
Jul. 12, 2018 (NL) .................................. 2021296

(51) Int. Cl.
*G03F 7/20* (2006.01)

(52) U.S. Cl.
CPC ...... *G03F 7/70358* (2013.01); *G03F 7/70525* (2013.01)

(58) Field of Classification Search
CPC ............ G03F 7/70358; G03F 7/70525; G03F 7/70141; G03F 7/705; G03F 7/70633;
(Continued)

(56) References Cited

U.S. PATENT DOCUMENTS

| 2006/0033921 A1 | 2/2006 | Den Boef et al. |
| 2006/0066855 A1 | 3/2006 | Den Boef et al. |

(Continued)

FOREIGN PATENT DOCUMENTS

| TW | 201721307 | 6/2017 |
| TW | 201805734 | 2/2018 |

(Continued)

OTHER PUBLICATIONS

International Search Report and Written Opinion issued in corresponding PCT Patent Application No. PCT/EP2019/053376, dated May 20, 2019.

(Continued)

*Primary Examiner* — Mesfin T Asfaw
(74) *Attorney, Agent, or Firm* — Pillsbury Winthrop Shaw Pittman LLP (57) ABSTRACT

A method for controlling a scanning exposure apparatus configured for scanning an illumination profile over a substrate to form functional areas thereon. The method includes determining a control profile for dynamic control of the illumination profile during exposure of an exposure field including the functional areas, in a scanning exposure operation; and optimizing a quality of exposure of one or more individual functional areas. The optimizing may include a) extending the control profile beyond the extent of the exposure field in the scanning direction; and/or b) applying a deconvolution scheme to the control profile, wherein the structure of the deconvolution scheme is based on a dimension of the illumination profile in the scanning direction.

20 Claims, 3 Drawing Sheets (58) Field of Classification Search
CPC ...... G03F 9/7026; G03F 7/70066; G03F 1/37; G03F 7/039; G03F 7/70341; G03F 7/2041; G03F 7/11; G03F 7/0382; G03F 7/70125; G03F 7/70441; G03F 7/70625; G03F 7/70483; G03F 7/70641; B82Y 30/00; G02B 17/0892; G06F 30/398

See application file for complete search history.

(56) References Cited

U.S. PATENT DOCUMENTS

| | | |
|---|---|---|
| 2006/0160037 A1 | 7/2006 | Brodsky et al. |
| 2007/0085991 A1 | 4/2007 | Liegl et al. |
| 2007/0247640 A1 | 10/2007 | Magome et al. |
| 2010/0201963 A1 | 8/2010 | Cramer et al. |
| 2011/0027704 A1 | 2/2011 | Cramer et al. |
| 2011/0043791 A1 | 2/2011 | Smilde et al. |
| 2011/0102753 A1 | 5/2011 | Van De Kerkhof et al. |
| 2012/0044470 A1 | 2/2012 | Smilde et al. |
| 2012/0123581 A1 | 5/2012 | Smilde et al. |
| 2013/0017476 A1 | 1/2013 | Ogawa |
| 2013/0258310 A1 | 10/2013 | Smilde et al. |
| 2013/0271740 A1 | 10/2013 | Quintanilha |
| 2015/0170904 A1 | 6/2015 | Tsen et al. |
| 2018/0239267 A1 | 8/2018 | Queens et al. |
| 2018/0292761 A1* | 10/2018 | Cekli ................. G03F 7/70258 |
| 2019/0235392 A1 | 8/2019 | Jeunink et al. |

FOREIGN PATENT DOCUMENTS

| | | |
|---|---|---|
| WO | 2009078708 | 6/2009 |
| WO | 2009106279 | 9/2009 |
| WO | 2013178422 | 12/2013 |
| WO | 2016146217 | 9/2016 |
| WO | 2018015121 | 1/2018 |

OTHER PUBLICATIONS

Taiwanese Office Action issued in corresponding Taiwanese Patent Application No. 108106240, dated Dec. 24, 2019.

Fanton, P. et al.: "Advanced in-Production Hotspot Prediction and Monitoring with Micro-Topography", IEEE, MIPRO, pp. 399-404 (May 22, 2017).

Vanoppen, P. et al.: "Analysis of Full Wafer/Full Batch CD Uniformity Using Electrical Line Width Measurements", Proc. of SPIE, vol. 4404 (May 30, 2001).

* cited by examiner

CONTROL METHOD FOR A SCANNING EXPOSURE APPARATUS

BACKGROUND

Cross Reference to Related Applications

This application is the U.S. national phase entry of PCT patent application no. PCT/EP2019/053376, which was filed on Feb. 12, 2019, which claims the benefit of priority of European patent application no. 18164962.5 which was filed on Mar. 29, 2018 and of Netherlands patent application no. 2021296 which was filed on Jul. 12, 2018, which are incorporated herein in their entireties by reference.

FIELD OF THE INVENTION

The present invention relates to methods and apparatus for applying patterns to a substrate in a lithographic process and/or measuring said patterns.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth (CD) of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Examples of known scatterometers include angle-resolved scatterometers of the type described in US2006033921A1 and US2010201963A1. The targets used by such scatterometers are relatively large, e.g., 40 μm by 40 μm, gratings and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

In performing lithographic processes, such as application of a pattern on a substrate or measurement of such a pattern, process control methods are used to monitor and control the process. Such process control techniques are typically performed to obtain corrections for across-substrate (inter-field) and within field (intra-field) process fingerprints. It would be desirable to improve such process control methods.

Furthermore, in general terms, a lithographic stage or servo positioning performance is expressed as a time Moving Average error (MA error) and a time Moving Standard Deviation (MSD) of the error. A critical time window here is the time interval that each point on a die is exposed (in other words: receives photons). If the average position error for a point on the die during this time interval is high (in other words: high MA-error), the effect is a shift of the exposed image, resulting in overlay errors. If the standard deviation of the position error during this time interval is high (in other words: high MSD error), the image may smear, resulting in fading errors. It would be desirable to reduce MSD and/or MA errors.

SUMMARY OF THE INVENTION

In a first aspect of the invention, there is provided a method for controlling a scanning exposure apparatus configured for scanning an illumination profile over a substrate to form functional areas thereon, the method comprising: obtaining a control profile for dynamic control of the illumination profile during exposure of an exposure field comprising the functional areas; and configuring the control profile to improve a quality of exposure of one or more individual functional areas by: a) extending the control profile beyond the extent of the exposure field in the scanning direction and/or b) applying a deconvolution scheme to the control profile, wherein the structure of the deconvolution scheme is based on a dimension of the illumination profile in the scanning direction.

In a second aspect of the invention, there is provided a scanning exposure apparatus comprising a processor operable to perform the method of any of the first aspect.

In a third aspect of the invention, there is provided a computer program comprising program instructions operable to perform the method of the second aspect when run on a suitable apparatus.

In a fourth aspect of the invention there is provided a method for determining a control profile for a scanning exposure apparatus configured to scan an illumination profile over a substrate to form an exposure field comprising functional areas thereon, the method comprising a step of determining a control profile for dynamic control of the illumination profile based on improving a quality of exposure of one or more individual functional areas by: a) allowing the control profile to extend beyond the exposure field and/or b) taking the dimension of the illumination profile in the scanning direction into account.

In a fifth aspect of the invention there is provided a method for controlling a scanning apparatus configured for scanning a beam of photons or particles across a substrate to form functional devices thereon, the method comprising: obtaining a control profile for dynamic control of the beam during scanning operation, wherein the beam is characterized by a beam profile comprising information of a spatial extension of the beam in at least a scanning direction; and optimizing a quality of beam control by applying a deconvolution scheme to the control profile, wherein the structure of the deconvolution scheme is based on the beam profile.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
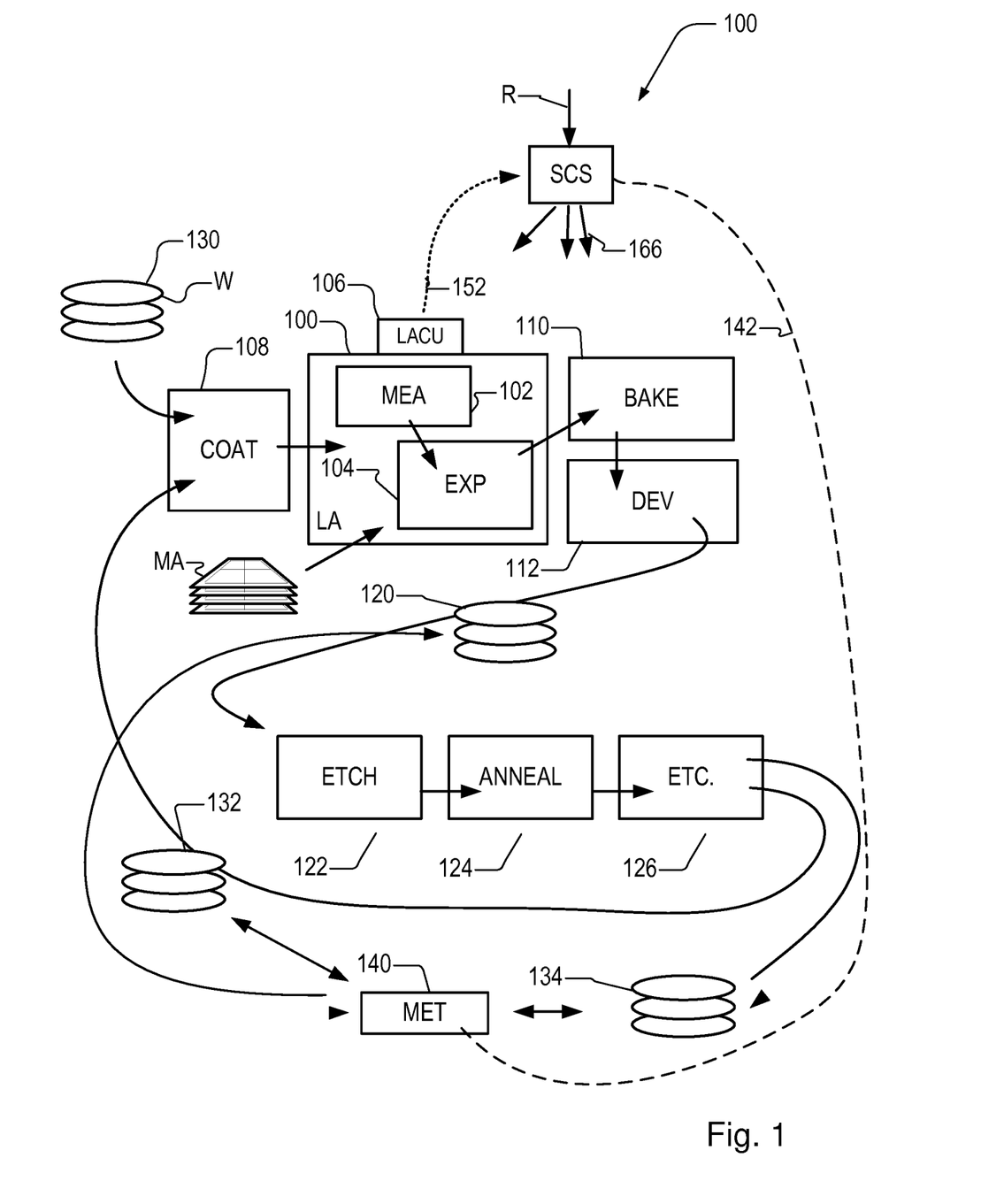
FIG. 1 depicts a lithographic apparatus together with other apparatuses forming a production facility for semiconductor devices.

FIG. 1 at 100 shows a lithographic apparatus LA as part of an industrial production facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 100 for short), a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station—between which the substrate tables can be exchanged.

Within the production facility, apparatus 100 forms part of a "litho cell" or "litho cluster" that contains also a coating apparatus 108 for applying photosensitive resist and other coatings to substrates W for patterning by the apparatus 100. At an output side of apparatus 100, a baking apparatus 110 and developing apparatus 112 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 120 are transferred to other processing apparatuses such as are illustrated at 122, 124, 126. A wide range of processing steps is implemented by various apparatuses in a typical manufacturing facility. For the sake of example, apparatus 122 in this embodiment is an etching station, and apparatus 124 performs a post-etch annealing step. Further physical and/or chemical processing steps are applied in further apparatuses, 126, etc. Numerous types of operation can be required to make a real device, such as deposition of material, modification of surface material characteristics (oxidation, doping, ion implantation etc.), chemical-mechanical polishing (CMP), and so forth. The apparatus 126 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 126 used at each layer may be completely different in type. Further, even where the processing steps to be applied by the apparatus 126 are nominally the same, in a large facility, there may be several supposedly identical machines working in parallel to perform the step 126 on different substrates. Small differences in set-up or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 140 which is provided for making measurements of parameters of the products at desired stages in the manufacturing process. A common example of a metrology station in a modern lithographic production facility is a scatterometer, for example a dark-field scatterometer, an angle-resolved scatterometer or a spectroscopic scatterometer, and it may be applied to measure properties of the developed substrates at 120 prior to etching in the apparatus 122. Using metrology apparatus 140, it may be determined, for example, that important performance parameters such as overlay or critical dimension (CD) do not meet specified accuracy requirements in the developed resist. Prior to the etching step, the opportunity exists to strip the developed resist and reprocess the substrates 120 through the litho cluster. The metrology results 142 from the apparatus 140 can be used to maintain accurate performance of the patterning operations in the litho cluster, by supervisory control system SCS and/or control unit LACU 106 making small adjustments over time, thereby minimizing the risk of products being made out-of-specification, and requiring re-work.

Additionally, metrology apparatus 140 and/or other metrology apparatuses (not shown) can be applied to measure properties of the processed substrates 132, 134, and incoming substrates 130. The metrology apparatus can be used on the processed substrate to determine important parameters such as overlay or CD.

During or before any actual imaging, the processing parameters may have a perturbation that causes them to deviate out of specification (e.g., outside of the process window; i.e., a space of processing parameters under which a pattern will be produced within specification) and thus may lead to defects. For example, the focus may change due to topography of a substrate to be exposed, drift in the substrate stage, deformation of the projection optics, etc.; the dose may change to due drift in the source intensity, dwell time, etc. Various techniques may be used to identify a processing parameter that is perturbed and to correct that processing parameter. For example, if the focus is perturbed, e.g., because an area of the substrate that is slightly raised from the rest of the substrate is being exposed, the substrate stage may be moved or tilted to compensate for the perturbation.

Control of the lithographic process are typically based on measurements fed back or fed forward and then modelled using, for example inter-field (across-substrate fingerprint) or intra-field (across-field fingerprint) models. Therefore modelling is typically limited to no better resolution than field fingerprint control, where a typical field may comprise 6 or 8 dies, for example. At present, process control at a sub-die level (intra-die models) is not typically performed. Within a die, there may be separate functional areas such as memory areas, logic areas, contact areas etc. Each different functional area, or different functional area type may have a different process window, each with a different processes window center. For example, different functional area types may have different heights, and therefore different best focus settings. Also, different functional area types may have different structure complexities and therefore different focus tolerances (focus process windows) around each best focus. However, each of these different functional areas will typically be formed using the same focus (or dose or position etc.) setting due to control grid resolution limitations.

The control of the lithographic apparatus may be achieved by modeling a correction profile (e.g., a control profile) for the relevant parameter (or co-optimized for more than one parameter). The modelled correction profile for each parameter is fed into the lithographic apparatus, which actuates the desired correction profile to control the lithographic process (exposure). The control may be based on feed forward models (e.g., from data measured within the lithographic apparatus prior to exposure). The scanner itself has self-correction which needs to be actuated during exposures by the scanner. These self-corrections comprise, for example feed forward models such as reticle heating and wafer heating, machine calibrations such as wafer table shape and layout dependent corrections.

Focus control is an example of a mainly feed forward control loop, based on a large amount of levelling data collected for each substrate which is used to determine corrections for exposure on that substrate which corrects for the surface topography. Other corrections are based on feedback control loops. Focus control may, in addition to the main feed forward control just mentioned, also have a feedback element based on measurement of focus from exposed structures. Overlay control is typically based on a feedback loop; based on measurement of overlay from processed substrates. Dose control has no feed forward control other than for mean dose, and is typically controlled in a feedback loop from post exposure (e.g., after-etch) measurement, via a correction profile determined per field (e.g., separately in the scan and slit directions).

All these sources of corrections are input into the lithographic apparatus, which combines all of the corrections per exposure and actuates them, to optimize overlay, focus, dose and imaging performance. There are a number of methods for the lithographic process to actuate the correction profile e.g., for control of focus/dose and/or overlay. An algorithm, essentially behaving as a filter, transforms the corrections into setpoints for the stages and lens/mirrors. The setpoints are defined as time-dependent trajectories e.g., which define the positioning and tilting of the reticle stage and/or wafer stage relative to each other during exposure. By moving accordingly, the actuators dynamically control focusing and positioning of an image of the reticle onto the substrate. Such methods and others will be readily apparent to the skilled person and will not be discussed further.

Controllability across the field is not constant and constraints on controllability may vary. For example, along the scan direction there may be limits on the spatial scale of control (spatial frequency limits). This causes an undesired variation in quality across the various dies (along the scan direction) within the field.

To address this, it is proposed to extend an exposure correction profile (e.g., for input to focus/dose or other actuators), for exposure of a field, beyond the regular (relevant) field dimension. As such that correction profile may be modelled to include an area outside the field, so as to define additional setpoints beyond the start and/or end of the regular profile. More specifically the correction profile for each field may be extended, so as to include control points (setpoints) immediately before and after the field in the scan direction. This may be achieved by using relevant data from immediately outside the field (e.g., from the extended area). However, it may be preferred to determine additional setpoints outside the field area based on die layout information within the field. In an embodiment, this correction profile extension may comprise appending one or more (average) die profiles outside the field, and as such can be based on knowledge of the (average) die profile within the field. The generated correction profile will result in a reduction of intra-die variation in the correction quality (e.g., dies of interest effectively all become central dies).

In an embodiment, the method may comprise decomposing a measured intra-field fingerprint into an intra-die and an "underlying intra-field fingerprint"; that is the intra-field fingerprint without the repeating (per die) intra-die component. It is then proposed that the intra-die fingerprints are corrected equally for all dies, including appended dies of an extended correction profile. A scaling factor fingerprint may be applied to the intra die fingerprint, if appropriate; and possibly also to the intra reticle fingerprint (or possibly not, depending on the known underlying physics, experimental data, or data analysis).

Figure 2:
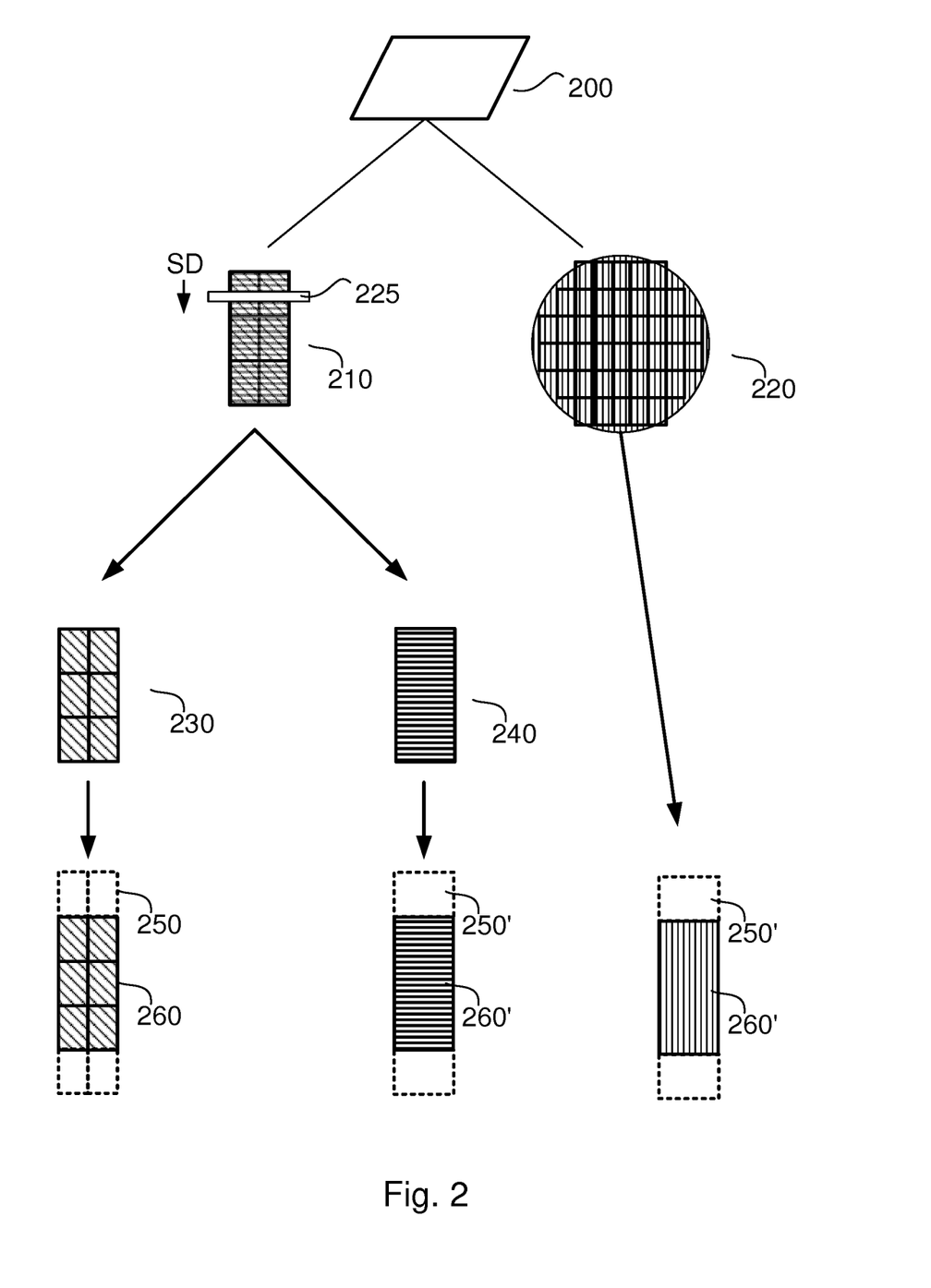
FIG. 2 is a flow diagram illustrating a method of control of a lithographic process using separation between intra die, intra reticle and inter field fingerprints and an extended control profile beyond the field limits

FIG. 2 illustrates this embodiment. The input is the raw (e.g., measured) data 200. This may comprise any across-substrate data, such as levelling data, overlay data, focus data, alignment data, dimensional data (e.g., critical dimension CD) etc., relevant for the correction profile to be determined. The raw data may comprise feed forward data from a substrate to be processed (e.g., as is typical for levelling data or alignment data), or feedback data relating to one or more previously processed substrates (e.g., as is typical for overlay data, focus data or CD data). At a first level, the raw data 200 is decomposed into an intra-field fingerprint 210 and inter-field fingerprint 220, wherein the intra-field fingerprint 210 is the component of the raw data which tends to repeat per field. The exposure slit 225 and scanning direction SD is shown for reference. At a second level, the intra-field fingerprint 210 is further decomposed into an intra-die fingerprint 230 and underlying intra-field fingerprint 240. The intra-die fingerprint 230 is the component of the intra-field fingerprint 240 which tends to repeat per die. This step may comprise determining the intra-die fingerprint 230, and subtracting it from the intra-field fingerprint 210 to reveal the underlying intra-field fingerprint 240.

At a final step, the correction profile for exposure of a field comprising a plurality of dies is extended to correct for an area larger than the field area. The correction profile may relate to (e.g., correcting for) one or more of the inter-field fingerprint 220, intra-die fingerprint 230 and underlying intra-field fingerprint 240. As such, the correction profile may comprise a co-optimized correction profile which simultaneously corrects (as much as possible) for each of these fingerprints over the extended area. More specifically, the correction profile for correcting the intra-die fingerprint 230 may be extended over additional dies 250 (dotted border and no shading), before and after the within-field dies 260 (e.g., the dies within field area) in the scanning direction SD. The intra-die fingerprint attributed to the additional dies 250 are assumed to be the same as determined for the field dies 260 (as the intra-die fingerprint is assumed the same for all dies). The correction profile for correcting the underlying intra-field fingerprint 240 may be extended beyond the field area 260' (e.g., via an extrapolation of the underlying intra-field fingerprint 240 data) to include correction for the same additional area 250' relating to additional dies 250. The correction profile which corrects the inter-field fingerprint 220 may be similarly extended to include correction for this additional area 250', e.g., by fitting the correction profile to the inter-field fingerprint 220 data relating to this area 250'.

In an embodiment, it is also proposed to enhance modeling of data for control purposes by using the fact that the data exhibits a repeating intra-die fingerprint 230. This knowledge can be used to effectively impose constraints on the model, weighting for solutions which show a similar tendency. Such a constraint can therefore be used to improve modeling of the intra-die fingerprint and/or the inter-die fingerprint in either or both the scan direction and slit direction. In particular, this intra-die fingerprint may be used to improve intra-field fingerprint estimation in the slit direction. This may be particularly useful for dose control across the slit.

A further issue for such correction and control of a lithographic process is that of "fading" or lack of contrast. Fading is the effect of the finite size of the slit and the light intensity profile therein on imaging performance. For the actuation of the stages in the horizontal plane (i.e., relating to overlay) and/or the vertical plane (i.e., relating to focus), present control algorithms translate the determined corrections into actuation setpoints; e.g., typically by minimizing RMS (root-mean-squared) residuals on the input corrections. Other optimization strategies may comprise maximizing the number of functional devices (dies-in-spec). The impact of fading is not considered during the optimization. This can have an impact on overlay and imaging for the exposed image.

Stage synchronization is characterized by Moving Standard Deviation (MSD) and Moving Average (MA) of the relative position of the substrate stage, with respect to the reticle stage, over the time window in which each image point travels across the illumination slit width. Fading is caused by a convolution of the determined high frequency correction (control profile) with the light intensity in the finite slit, resulting in an adverse MA and MSD impact. A typical current strategy for horizontal stage actuation, for example, is to define a wafer stage trajectory by a fitting algorithm which minimizes the RMS residuals on the input fingerprint. The assumption behind this is that the slit is infinitesimally small. As a result, no fading is considered, and the performance on resist is a direct translation of the stage trajectory residuals (i.e., fit residuals). This assumption begins to fail in the presence of high frequency trajectories and the resultant fading effects will induce imaging penalties, through MSD. Moreover, the expectation on the overlay or focus, i.e., the MA evaluation, shows significant deterioration with respect to simple fitting residuals.

It is therefore proposed to address this issue by defining a strategy for a balanced and optimal MA-MSD performance when actuating fingerprint through the scanner. The proposal comprises taking into account the known finite slit width (the slit dimension in the scan direction) when determining the correction profile. This may comprise deconvolving the effect of the slit width (e.g., the intensity profile within the slit) from the correction profile, using an appropriate scheme, to determine a deconvolved correction profile which provides improved performance during exposure. In a more specific embodiment, the method may comprise using a Wiener Filter based algorithm to address the fading issue, when determining the correction profiles and defining scanner actuators trajectories. The proposed technique optimizes MA performance, overlay performance, focus performance, and MSD performance, and therefore imaging performance. The proposed technique can also be made flexible in terms of MA versus MSD balance for specific applications.

Figure 3:
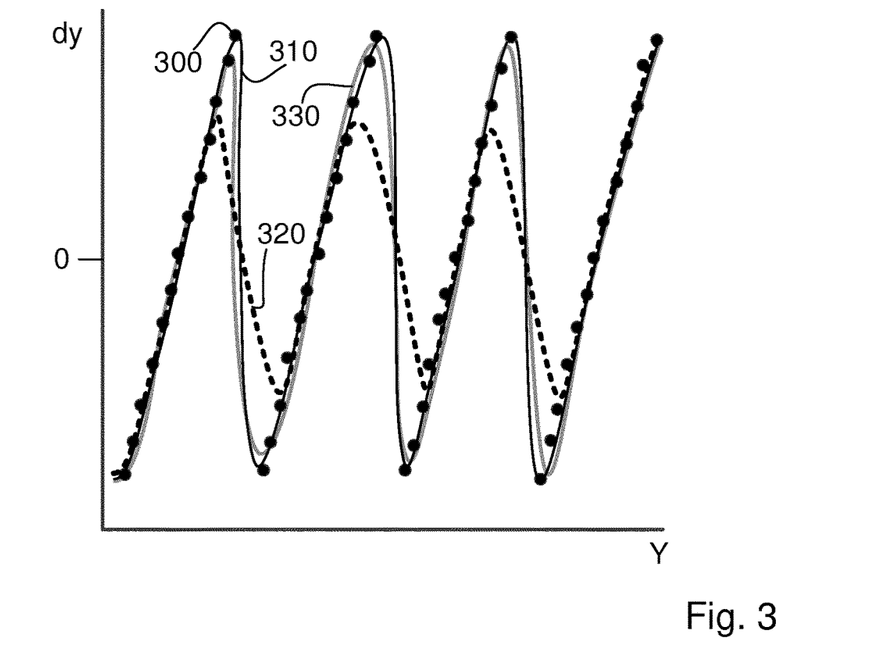
FIG. 3 is a graph of an overlay metric dy against field position Y, showing a correction profile for a saw-tooth pattern, the effect of slit convolution on the correction profile, and the effect of performing a further slit deconvolution in accordance with an embodiment of the invention.

One example of a high frequency intra-die fingerprint which may be encountered (e.g., in a 3DNAND production process) is that caused by a magnification in the scanning direction, per die. This fingerprint essentially forms a saw-tooth shape along the scanning direction, which can result in a saw-tooth overlay pattern, particularly without or with non-ideal correction. FIG. 3 illustrates this issue. It comprises a plot of the dy (i.e., overlay) against the scanning direction Y. Each dot 300 represents a (e.g., measured) data point. The fitted solid line 310 is the correction profile to be actuated, which corresponds to the intra-die fingerprint as fitted to the data points (e.g., RMS-minimized stage trajectory). The saw tooth pattern exhibited in the fingerprint is evident. The dotted line 320 is the predicted MA results as would actually be achieved using present methods, this representing a convolution of the correction profile 310 with the slit intensity profile.

Figure 4:
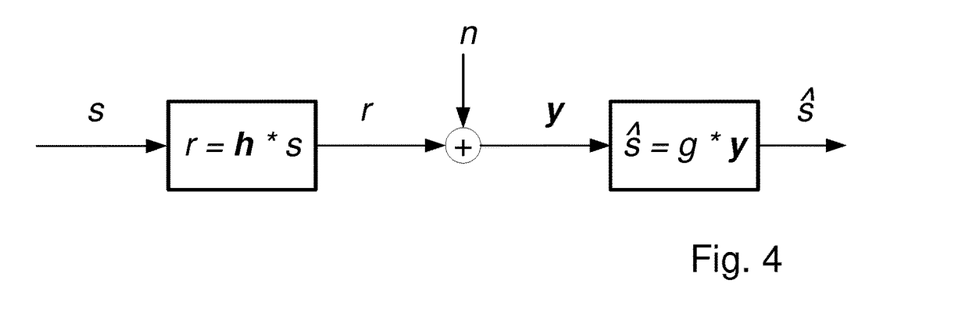
FIG. 4 is a flow diagram illustrating the problem of convolution of the correction profile with the intensity profile within the exposure slit.

FIG. 4 recasts the problem in mathematical terms, relating the fading to the convolution with intensity profile within the slit. The problem is also generalized for noise injected in the desired corrections; the reason for this will be described below. FIG. 4 shows that a present convolved noisy correction profile y comprises the input correction profile or setpoints s convolved 400 with slit intensity profile h to obtain noise-free convolved correction profile r which is subject to an injection of noise n. Only the (noisy) convolved correction profile y and slit intensity profile h (i.e., the terms represented in boldface on the Figure) are known. The aim is to deconvolve the slit profile 410 by determine a "deslitting" or deconvolution profile g which minimizes the difference (e.g., minimizes the mean-squared error or RMS error) between corrected (or "deslitted") correction profile or setpoints ŝ and input correction profile s, given the slit intensity profile h and convolved noisy correction profile y. Where the convolved noisy correction profile y is the available correction (as is the case here), then the problem becomes estimating the deslitted correction profiles ŝ that, if actuated, would minimize the slit convolution error. In the presence of noise, the variables are random variable, and therefore the expected value of deconvolution profile g may be taken to be:

$$g = \text{argmin } E(s-\hat{s})^2$$

In an embodiment, it is proposed to use a Weiner filter to solve this problem. The Wiener filter is a technique used in signal processing to extract a desired signal out of an observed noisy process. The Wiener filter can be used, for instance, to recover an image which is blurred by a known low-pass filter. The Wiener filtering executes an optimal trade-off between inverse filtering and noise smoothing.

Figure 5:
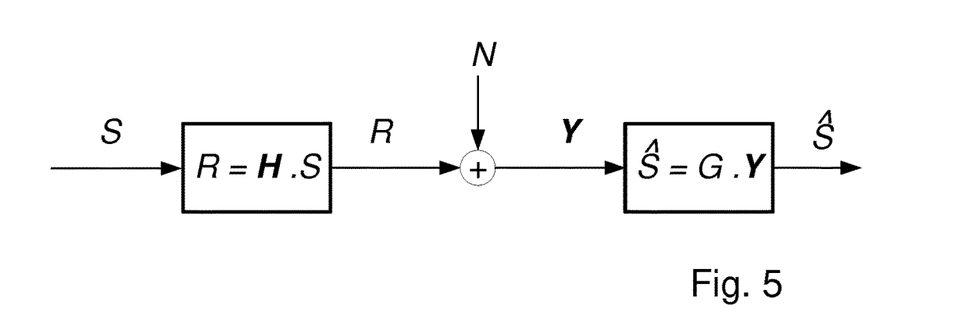
FIG. 5 is a flow diagram illustrating a method of deconvolution of the exposure slit intensity profile from the correction profile using a Weiner filter, in accordance with an embodiment of the invention.

FIG. 5 illustrates the Weiner filter solution. This solves the problem in the frequency domain by taking the Fourier transform or FFT of each of the variables shown in FIG. 4 (in FIG. 5, uppercase variables represent the transformed variables equivalent to those of FIG. 4). This simplifies the solution as the convolution now becomes a multiplication. The problem becomes:

$$G(f) = \text{argmin } E|S(f) - \widehat{S(f)}|^2$$

which can be solved by:

$$G(f) = \frac{H^*(f) S_{PSD}(f)}{|H(f)|^2 S_{PSD}(f) + N_{PSD}(f)}$$

where $S_{PSD}(f)$ is the mean power spectral density of the original correction profile s, $N_{PSD}(f)$ is the mean power spectral density of the noise n and the superscript * denotes a complex conjugation.

In a further embodiment, the noise $N_{PSD}(f)$ term may be used to tune the optimization between MA and MSD. In an embodiment, the noise term $N_{PSD}$ may be assumed to take a single value (white noise) over all frequencies f. A lower value for the noise term $N_{PSD}$ will enhance MA while degrading MSD, a higher value the do the opposite.

Several Noise levels can be studied by considering the PSD of the signal. For the saw-tooth pattern being considered here, it has been found that a noise level of an order of magnitude of $10^{-19}$, and more specifically (for example) of $7 \times 10^{-19}$ may be optimal for best MA performance; and a noise level of an order of magnitude of $10^{-17}$, and more specifically (for example) of $4 \times 10^{-17}$ may be optimal for best MSD performance. These values have been considered for different amplitudes of the saw-tooth shapes, and for fingerprints comprising repetitions of S-shapes, rather than the saw-tooth shape, and proved to be stable in delivering the best MA/MSD.

As such, a Wiener filter can be used to solve the problem illustrated by FIG. 4 and therefore provide deconvolved, corrected (deslitted) setpoints s for the actuators in the scanner. Referring back to FIG. 3, this will result in a much closer match for the convolved and deconvolved correction profile (gray line) 330, determined using the method described by FIG. 5, with the original correction profile to be actuated 310. This will be particularly the case when the noise term is optimized for MA (e.g., optimized for best focus/overlay). Depending on the application, the noise term could instead be optimized for MSD to improve contrast and process latitude.

While this embodiment is described specifically in terms of overlay caused by intra-die stress in the 3D-NAND process, it can be used to correct any other higher-order (e.g., overlay or focus) fingerprint in the scan direction.

It should be noted that both of the main concepts (extension of correction profile outside of the field area and deconvolution or deslitting of the correction profile) can be combined. In fact, there is significant benefit in combining the deconvolution embodiment with a (e.g., small) extension of the control signal, as any deconvolution scheme is typically improved by provision of some setpoints outside the exposure field in order to generate more sensible results for the boundary points of the correction profile.

It should be further appreciated that the Wiener Filter based deconvolution scheme has far more extensive application than the lithography tools described herein. Such a concept can be extended to any imaging tools which uses a beam of photons or particles (for example electrons) to print a desired image on a substrate (e.g., in resist/or to produce masks etc.).

In particular the use of a deconvolution scheme to improve a control profile of positioning of a beam of photons or particles with respect to a substrate may be adopted. Analog to a scanning exposure apparatus having an illumination profile of finite length, also a beam of photons or particles has a dimension which may be relatively large when compared to the size of the functional devices that need to be applied to the substrate. The substrate in this example may be a reticle blank coated with a photoresist. The beam in this example will often be a beam of electrons as normally reticles (patterning devices) are patterned using an e-beam writing tool. In addition to control of the beam position (typically with respect to coordinates within a plane of the substrate, being of importance of overlay error between layers on the substrate), control of the beam focus, beam intensity (dose) and beam extension (divergence and beam profile) may be pursued to optimize a quality of the functional devices. The quality of the beam control may be an important property to assure properly manufactured functional devices on a patterning device or another substrate (wafer).

In an embodiment a method for controlling a scanning exposure apparatus configured for scanning a beam of photons or particles across a substrate to form functional devices thereon is disclosed, the method comprising: determining a control profile for dynamic control of the beam during scanning operation, wherein the beam is characterized by a beam profile comprising information of a spatial extension of the beam in at least a scanning direction; and optimizing a quality of beam control by applying a deconvolution scheme to the control profile, wherein the structure of the deconvolution scheme is based on the beam profile.

In another embodiment the control profile is for control of one or more of: exposure dose (beam energy or intensity), focus of the beam, position of the beam in a plane of the substrate (overlay).

In another embodiment the control profile comprises a convoluted control profile which is convoluted with the beam profile, and said deconvolution scheme deconvolves the convoluted control profile to minimize an error resultant from the convolution.

In another embodiment the deconvolution scheme comprises determining a Weiner deconvolution filter which deconvolves the convoluted control profile and beam profile in the presence of noise.

In another embodiment a value for a noise term in said Weiner filter is selected to optimize a particular aspect of the beam control.

In another embodiment the selection of the value for the noise term comprises tuning the balance between optimizing for moving average or optimizing for moving standard deviation, describing positioning performance of the beam relative to the substrate.

In further embodiments the control profile is determined by a computer system taking into account that extension of the control profile beyond the length of the exposure field is allowed and/or the control profile is determined taking a dimension of the illumination profile in the scanning direction into account. It is hence not essential to improve on an existing control profile by either extension and/or deconvolution operations, when generating a control profile the possibility of extension and/or taking the finite dimension of the illumination profile into account may be utilized to generate a control profile that intrinsically provides a good quality of exposure for one or more functional areas comprised within the exposure field.

In an embodiment a control profile for dynamic control of the illumination profile is based on improving a quality of exposure of one or more individual functional areas by: a) allowing the control profile to extend beyond the exposure field and/or b) taking the dimension of the illumination profile in the scanning direction into account.

In another embodiment the control profile defines setpoints over time for one or more actuators which actuate the scanning exposure apparatus.

In another embodiment allowing the control profile to extend beyond the exposure field comprises determining setpoints for the actuators for times preceding and/or subsequent to an exposure time period corresponding to the exposure of the exposure field.

In another embodiment the control profile is allowed to extend beyond the exposure field by an amount which is dependent on a dimension of the functional areas.

In another embodiment each functional area comprises a pattern which is repeated over the field, and which corresponds to an individual die on the exposed substrate, and said control profile is allowed to extend by at least one scan-in extension profile which precedes the exposure time period and corresponds to an extended scan-in area, and at least one scan-out extension profile which follows the exposure time period and corresponds to an extended scan-out area.

In another embodiment the control profile is for control of one or more of: exposure dose, focus, overlay and leveling.

In another embodiment taking the dimension of the illumination profile into account comprises convoluting the control profile with said illumination profile as defined by an exposure slit and deconvoluting the control profile using a deconvolution scheme to minimize an error resultant from the convolution.

In another embodiment the deconvolution scheme comprises determining a Weiner deconvolution filter which deconvolves the convoluted control profile and illumination profile in the presence of noise.

In another embodiment selecting a value for the noise term in said Weiner filter is used to improve the control profile.

In another embodiment a control recipe for the scanning exposure apparatus is generated based on the control profile.

Further embodiments of the inventions are disclosed in the list of numbered clauses below:

1. A method for controlling a scanning exposure apparatus configured for scanning an illumination profile over a substrate to form functional areas thereon, the method comprising:

determining a control profile for dynamic control of the illumination profile during exposure of an exposure field comprising the functional areas, in a scanning exposure operation; and optimizing a quality of exposure of individual functional areas by:

a) extending the control profile beyond the extent of the exposure field in the scanning direction; and/or b) applying a deconvolution scheme to the control profile, wherein the structure of the deconvolution scheme is based on a dimension of the illumination profile in the scanning direction.

2. A method according to clause 1, wherein said control profile defines setpoints over time for one or more actuators which actuate the scanning exposure operation, and said step of extending the control profile comprises determining setpoints for the actuators for times preceding and/or subsequent to an exposure time period corresponding to the exposure of the exposure field.

3. A method according to clause 1 or 2, wherein said control profile is extended by appending an extension profile which is dependent on a dimension of the functional areas.

4. A method according to clause 3, wherein each functional area comprises a pattern which is repeated over the field, and which corresponds to an individual die on the exposed substrate, and said control profile is extended by appending at least one scan-in extension profile which precedes the exposure time period and corresponds to an extended scan-in area, and at least one scan-out extension profile which follows the exposure time period and corresponds to an extended scan-out area.

5. A method according to clause 4, comprising the step of determining an average correction profile relating to each functional area and defining the scan-in extension profile and scan-out extension profile as said average correction profile.

6. A method according to clause 5, wherein said average correction profile is determined based on an intra-die component of the control profile.

7. A method according to clause 6, comprising decomposing the control profile into said intra-die component, an underlying intra-field component and an inter-field component.

8. A method according to clause 7, comprising extending the intra-die component of the control signal by appending repetitions of the intra-die component over said extended scan-in area and said extended scan-out area.

9. A method according to clause 7 or 8, further comprising extending the underlying intra-field component of the control signal by extrapolating over said extended scan-in area and said extended scan-out area; and/or extending the inter-field component by fitting the inter-field component data relating to said extended scan-in area and said extended scan-out area.

10. A method according to any of clauses 6 to 9, comprising determining a constraint from said intra-die component in a modelling step to model control of the scanning exposure operation in one or both of the scan direction and slit direction, so as to determine the control profile.

11. A method according to any preceding clause, wherein said control profile is for control of one or more of: exposure dose, focus, overlay and leveling.

12. A method according to any preceding clause, wherein said control profile comprises a convoluted control profile which is convoluted with said illumination profile as defined by an exposure slit, and said deconvolution scheme deconvolves the convoluted control profile to minimize an error resultant from the convolution.

13. A method according to clause 12, wherein said deconvolution scheme comprises determining a Weiner deconvolution filter which deconvolves the convoluted control profile and illumination profile in the presence of noise.

14. A method according to clause 13, comprising selecting a value for the noise term in said Weiner filter to optimize a particular aspect of control.

15. A method according to clause 14, wherein said selecting a value for the noise term comprises tuning the balance between optimizing for moving average or optimizing for moving standard deviation, describing positioning performance related to the relative positions of a substrate stage for holding the substrate and a reticle stage for holding a patterning device.

16. A method according to any preceding clause comprising performing one or more subsequent exposure operations according to said control profile.

17. A scanning exposure apparatus comprising a processor operable to perform the method of any of clauses 1 to 16.

18. A scanning exposure apparatus according to clause 17, further comprising:
an illumination source for providing exposure illumination;
a reticle stage for holding a patterning device which patterns said exposure illumination; and
a substrate stage for holding the substrate.

19. A computer program comprising program instructions operable to perform the method of any of clauses 1 to 16 when run on a suitable apparatus.

20. A non-transient computer program carrier comprising the computer program of clause 19.

21. A method for controlling a scanning exposure apparatus configured for scanning a beam of photons or particles across a substrate to form functional devices thereon, the method comprising:
obtaining a control profile for dynamic control of the beam during scanning operation, wherein the beam is characterized by a beam profile comprising information of a spatial extension of the beam in at least a scanning direction; and
optimizing a quality of beam control by applying a deconvolution scheme to the control profile, wherein the structure of the deconvolution scheme is based on the beam profile.

22. A method according to clause 21, wherein said control profile is for control of one or more of: exposure dose, focus, overlay and leveling.

22. A method according to clause 21 or 22, wherein said control profile comprises a convoluted control profile which is convoluted with the beam profile, and said deconvolution scheme deconvolves the convoluted control profile to minimize an error resultant from the convolution.

23. A method according to clause 22, wherein said deconvolution scheme comprises determining a Weiner deconvolution filter which deconvolves the convoluted control profile and beam profile in the presence of noise.

24. A method according to clause 23, comprising selecting a value for the noise term in said Weiner filter to optimize a particular aspect of the beam control.

25. A method according to clause 24, wherein said selecting a value for the noise term comprises tuning the balance between optimizing for moving average or optimizing for moving standard deviation, describing positioning performance related to the relative positions of a substrate stage for holding the substrate and the beam.

26. A method according to any of clauses 21 to 25, further comprising performing one or more subsequent scanning operations according to said control profile.

27. An exposure apparatus comprising a processor operable to perform the method of any of clauses 21 to 26.

28. An exposure apparatus according to clause 27, further comprising:
a source for providing the photons or particles; and
a substrate stage for holding the substrate.

29. A computer program comprising program instructions operable to perform the method of any of clauses 21 to 26 when run on a suitable apparatus.

30. A non-transient computer program carrier comprising the computer program of clause 29.

31. A method for controlling a scanning exposure apparatus configured for scanning an illumination profile over a substrate to form functional areas thereon, the method comprising: obtaining a control profile for dynamic control of the illumination profile during exposure of an exposure field comprising the functional areas, in a scanning exposure operation; and modifying the control profile to improve a quality of exposure of one or more individual functional areas by: a) extending the control profile beyond the extent of the exposure field in the scanning direction and/or b) applying a deconvolution scheme to the control profile, wherein the structure of the deconvolution scheme is based on a dimension of the illumination profile in the scanning direction.

32. A method for determining a control profile for a scanning exposure apparatus configured to scan an illumination profile over a substrate to form an exposure field comprising functional areas thereon, the method comprising a step of determining a control profile for dynamic control of the illumination profile based on improving a quality of exposure of one or more individual functional areas by: a) allowing the control profile to extend beyond the exposure field and/or b) taking the dimension of the illumination profile in the scanning direction into account.

33. The method of clause 32, wherein said control profile defines setpoints over time for one or more actuators which actuate the scanning exposure apparatus.

34. The method of clause 33, wherein allowing the control profile to extend beyond the exposure field comprises determining setpoints for the actuators for times preceding and/or subsequent to an exposure time period corresponding to the exposure of the exposure field.

35. The method of clause 34, wherein said control profile is allowed to extend beyond the exposure field by an amount which is dependent on a dimension of the functional areas.

36. The method of clause 35, wherein each functional area comprises a pattern which is repeated over the field, and which corresponds to an individual die on the exposed substrate, and said control profile is allowed to extend by at least one scan-in extension profile which precedes the exposure time period and corresponds to an extended scan-in area, and at least one scan-out extension profile which follows the exposure time period and corresponds to an extended scan-out area.

37. The method of clause 32, wherein said control profile is for control of one or more of: exposure dose, focus, overlay and leveling.

38. The method of clause 32, wherein said taking the dimension of the illumination profile into account comprises convoluting the control profile with said illumination profile as defined by an exposure slit and deconvoluting the control profile using a deconvolution scheme to minimize an error resultant from the convolution.

39. The method of clause 38, wherein said deconvolution scheme comprises determining a Weiner deconvolution filter which deconvolves the convoluted control profile and illumination profile in the presence of noise.

40. The method of clause 39, comprising selecting a value for the noise term in said Weiner filter to improve the control profile.

41. The method of any of clauses 1-26 or 31-40, further comprising generating a control recipe for the scanning exposure apparatus based on said control profile.

A class of control algorithms for a lithographic apparatus is so-called Dies In Specification (DIS) control. This method utilizes a control strategy which is targeted to obtain a maximum number of functioning devices manufactured on a substrate. Typically this is achieved by utilizing a non-linear optimization method striving to limit the number of occasions in which the maximum absolute value of a performance parameter exceeds a critical threshold is minimized (also called "max abs optimization).

A common objection against typical Dies In Specification (DIS) (max abs optimization based) control algorithms is that they would not be robust, because of sensitivity to outliers and reduced reliability when depending on measurement data which is sparsely distributed across a substrate (sparse sampling). A common way of dealing with outliers is to use an estimation model on measurement data (and an optimization model after that to create scanner setpoint profiles). The estimation model is supposed to filter outliers, and typically limits the data content to an expected kind of shape (a model).

A modern scanning exposure apparatus allows dynamic control of correction devices during the exposure of a die on a reticle. Hence with a certain resolution (depending on the involved actuator(s) and the dimension of the illumination profile in the scanning direction) a control profile for the correction devices may be dynamically adapted along the scanning direction. This allows dynamic optimization of a correction profile defined across the slit direction during the scanning exposures of the die on the patterning device (reticle).

The here proposed control strategy modifies a static DIS based focus or overlay control (for example leveling) algorithm. A static DIS control method considers measurements associated with a die area and calculates a control profile which is constant during the scanning exposure of the die and maximizes the probability of the die being functional (e.g. yielding a functional device).

This static strategy is however not optimal as the dynamic adjustment of the control profile is not taken into account in case of pursuing a DIS control strategy. Hence a new control strategy is proposed targeted to achieve a maximum amount of yielding dies by splitting a (static) 2D optimization into two 1D optimizations (separated into slit direction and scan direction). The key assumption of the algorithm is that for practical cases the DIS optimization is limited by performance parameters (typically related to yield of a process) variations across the slit direction, meaning that the scan direction is of secondary importance. From that we first determine setpoints for the correction devices per position along the scan direction and then (low pass) filter these setpoints to create an actuatable control profile. Actuatable refers here to the achievable dynamical control of the control profile across the scan direction (mainly limited by the finite dimension of the illumination profile in the scanning direction).

The slit direction DIS optimization is done first for a plurality of positions across the scanning direction. This involves determination of a control profile based on a max abs optimization applied to performance parameter data associated with an area oriented along the slit direction (X-axis), but limited to a certain range of Y-positions (Y-axis is here the scanning direction). This determination of control profiles is repeated for various Y-coordinates. The set of control profiles may be filtered to derive a dynamical control profile strategy which is compatible with the correction capabilities of the lithographic apparatus (e.g. the resolution in the Y-direction of the correction associated with the control profile). Alternatively the chosen range of the Y-coordinates associated with the areas used to determine the control profile may be chosen according to resolution limitations of the corrections. Alternatively the control profile may be determined based on performance parameter data associated with multiple areas, each area located at a different Y-coordinate. Additionally control profile parameters may be defined, determined as a function of the Y-coordinate using a DIS based control algorithms and subsequently a fitting function may be used to describe the control profile as a function of the Y-coordinate.

In an embodiment a method to control processing of substrates is disclosed, the method comprising: a) obtaining values of a performance parameter related to yield across a region of a substrate; b) dividing the region into a plurality of sub-regions, each sub-region dimensioned in dependence of a spatial resolution of process control; and c) determining control profile settings based on non-linear modeling of values of the performance parameter per individual sub-region or subset of the plurality of sub-regions.

In an embodiment the method further comprises a step of filtering the control profile settings based on the spatial resolution.

In an embodiment the method further comprises a step of fitting a control profile setting parameter to a function defined over the region.

In practice it is not always possible to achieve a 100% Dies in Specification situation. It would be advantageous to release control constraints on certain dies across the wafer in order to guarantee that enough control potential is available to still have an optimum amount of yielding dies. The selection of the dies which are most limiting the probabilities of having an acceptable number of dies meeting specification needs to quantified in order to make this proposed strategy viable.

In this document it is proposed to use Linear/Quadratic Programming (LP/QP) principles to select the dies which are most limiting the yield.

An objective function is defined mapping a control profile to an expected performance parameter distribution. The control profile is optimized to determine an optimal control profile across a field (e.g. performance parameter does not exceed critical limit at any position within the field). The field in general comprises a plurality of dies (representing functional devices). To ensure each dies is yielding the control profile settings are constrained to the requirement that the objective function mapping the control profile also generates performance parameter data which is within specification for each die (100% yield). Additionally the control profile settings are constrained to achievable control profile settings (based on characteristics of the actuators used for control for example).

As said, a solution "all dies in spec" does however not always exists, so some one or more dies then need to be sacrificed. A possibility is to remove dies from the constraints and verify which particular die removal(s) are optimal. Here it is proposed to consider the die specific constraints as objective functions. The Lagrange multipliers associated with these objective functions are calculated. The dies for which control is most limited by the constraints have the largest number of non-zero valued Lagrange multipliers. These dies are removed first. It is expected that in this way most control potential is released for the other dies.

In an embodiment a method to control a process is disclosed, the method comprising: a) obtaining values of a performance parameter related to a yield of the process across a region on a substrate subject to the process; b) dividing the region into a plurality of sub-regions; and c) determining a control setting for processing the region based on the values of the performance parameter and an expected yield of one or more sub-regions.

Although patterning devices in the form of a physical reticle have been described, the term "patterning device" in this application also includes a data product conveying a pattern in digital form, for example to be used in conjunction with a programmable patterning device.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method for controlling a scanning exposure apparatus configured for scanning an illumination profile over a substrate to form functional areas thereon, the method comprising:
   obtaining a control profile for dynamic control of the illumination profile during scanning exposure of an exposure field comprising the functional areas; and
   configuring, by a hardware computer system, the control profile to improve a quality of exposure of one or more individual functional areas comprised within the exposure field by:
   a) extending the control profile beyond the extent of the exposure field in the scanning direction by appending an extension profile which is dependent on a dimension of one or more of the functional areas; and/or
   b) applying a deconvolution scheme to the control profile, wherein the structure of the deconvolution scheme is based on a dimension of the illumination profile in the scanning direction.

2. The method as claimed in claim 1, wherein the control profile defines setpoints over time for one or more actuators which actuate the scanning exposure operation.

3. The method as claimed in claim 2, wherein the configuring of the control profile includes the extending the control profile and the extending the control profile comprises determining setpoints for the one or more actuators for times preceding, and/or subsequent to, an exposure time period corresponding to the exposure of the exposure field.

4. The method as claimed in claim 1, wherein each functional area comprises a pattern which is repeated over the field, and which corresponds to an individual die on the exposed substrate, and wherein the configuring of the control profile includes the extending the control profile and the control profile is extended by appending at least one scan-in extension profile which precedes the exposure time period and corresponds to an extended scan-in area, and at least one scan-out extension profile which follows the exposure time period and corresponds to an extended scan-out area.

5. The method as claimed in claim 4, further comprising determining an average correction profile relating to each functional area and defining the scan-in extension profile and scan-out extension profile as the average correction profile.

6. The method as claimed in claim 5, wherein the average correction profile is determined based on an intra-die component of the control profile.

7. The method as claimed in claim 6, further comprising decomposing the control profile into the intra-die component, an underlying intra-field component and an inter-field component.

8. The method as claimed in claim 1, wherein the control profile is for control of one or more selected from: exposure dose, focus, overlay and/or leveling.

9. The method as claimed in claim 1, wherein the control profile comprises a convoluted control profile which is convolved with the illumination profile as defined by an exposure slit, and wherein the configuring of the control profile includes the applying a deconvolution scheme to the control profile and the deconvolution scheme deconvolves the convoluted control profile to reduce an error resultant from the convolution.

10. The method as claimed in claim 9, wherein the deconvolution scheme comprises determining a Weiner deconvolution filter which deconvolves the convoluted control profile and illumination profile in the presence of noise.

11. The method as claimed in claim 10, further comprising selecting a value for a noise term in the Weiner filter to improve control of the scanning exposure apparatus.

12. The method as claimed in claim 1, wherein the configuring of the control profile is implemented by applying the deconvolution scheme and further comprising performing one or more subsequent exposure operations according to the deconvolved control profile.

13. A computer program product comprising a non-transitory computer-readable medium comprising program instructions therein, the instructions, upon execution by a computer apparatus, configured to cause the computer apparatus to at least:
    obtain a control profile for dynamic control of an illumination profile during scanning exposure of a substrate with an exposure field comprising functional areas; and
    configure the control profile to improve a quality of exposure of one or more individual functional areas comprised within the exposure field by:
        a) extension of the control profile beyond the extent of the exposure field in a scanning direction by appending an extension profile which is dependent on a dimension of one or more of the functional areas; and/or
        b) application of a deconvolution scheme to the control profile, wherein the structure of the deconvolution scheme is based on a dimension of the illumination profile in the scanning direction.

14. A scanning exposure apparatus comprising the computer program product of claim 13.

15. A method for controlling a scanning apparatus configured for scanning a beam of photons or particles across a substrate to form functional devices thereon, the method comprising:

obtaining a control profile for dynamic control of the beam during scanning operation, wherein the beam is characterized by a beam profile comprising information of a spatial extension of the beam in at least a scanning direction; and improving a quality of beam control by applying, by a hardware computer system, a deconvolution scheme to the control profile, wherein the structure of the deconvolution scheme is based on the beam profile.

16. A method for determining a control profile for a scanning exposure apparatus configured to scan an illumination profile over a substrate to form an exposure field comprising functional areas thereon, the method comprising determining a control profile for dynamic control of the illumination profile based on improving, by a hardware computer system, a quality of exposure of one or more individual functional areas by: a) allowing the control profile to extend beyond the exposure field and/or b) taking a dimension of the illumination profile in the scanning direction into account.

17. The method as claimed in claim 16, wherein the control profile defines setpoints over time for one or more actuators which actuate the scan of the illumination profile.

18. The method as claimed in claim 17, further comprising generating a control recipe for the scanning exposure apparatus based on the control profile.

19. The method as claimed in claim 17, wherein the determining a control profile comprising allowing the control profile to extend beyond the exposure field and the allowing the control profile to extend beyond the exposure field comprises determining setpoints for the one or more actuators for times preceding, and/or subsequent to, an exposure time period corresponding to the exposure of the exposure field.

20. The method as claimed in claim 16, wherein the determining a control profile comprises taking the dimension of the illumination profile into account and the taking the dimension of the illumination profile into account comprises convolving the control profile with the illumination profile as defined by an exposure slit and deconvolving the control profile using a deconvolution scheme to reduce an error resultant from the convolution.

* * * * *